United States Patent [19]

Nate et al.

[11] Patent Number: 4,544,729
[45] Date of Patent: Oct. 1, 1985

[54] PHOTO AND RADIATION-SENSITIVE ORGANOPOLYMERIC MATERIAL

[75] Inventors: Kazuo Nate, Machida; Takashi Inoue, Yokohama; Hitoshi Yokono, Fujisawa; Mitsuo Ishikawa, Hirakata; Makoto Kumada, Ibaraki, all of Japan

[73] Assignee: Hitachi, Ltd., Tokyo, Japan

[21] Appl. No.: 623,168

[22] Filed: Jun. 22, 1984

[30] Foreign Application Priority Data

Jun. 24, 1983 [JP] Japan ................................. 58-112744
Jul. 1, 1983 [JP] Japan ................................. 58-118332
Aug. 24, 1983 [JP] Japan ................................. 58-153294
Sep. 16, 1983 [JP] Japan ................................. 58-169185

[51] Int. Cl.$^4$ ............................................. C08G 77/04
[52] U.S. Cl. ................................. 528/28; 204/159.13; 528/35; 430/270; 430/272; 430/311

[58] Field of Search ....................... 430/270, 272, 311; 204/159.13; 528/28, 35

[56] References Cited

U.S. PATENT DOCUMENTS

| 2,696,480 | 12/1954 | Gordon et al. | 528/35 |
| 4,339,562 | 7/1982 | Guselnikov | 528/14 |
| 4,358,576 | 11/1982 | Yajima et al. | 528/30 |
| 4,377,677 | 3/1983 | Iwai et al. | 528/35 |
| 4,481,279 | 11/1984 | Naito et al. | 430/280 |

Primary Examiner—Jack P. Brammer
Attorney, Agent, or Firm—Antonelli, Terry & Wands

[57] ABSTRACT

A photo and radiation sensitive-organopolymeric material having at least one Si—Si)$_n$ bond, wherein n is an integer of from 1 to 5 has a good resistance to dry etching, a good adhesion and a good heat resistance and is useful for finer patterning with a good resolution.

6 Claims, 2 Drawing Figures

PHOTO AND RADIATION-SENSITIVE ORGANOPOLYMERIC MATERIAL

BACKGROUND OF THE INVENTION

This invention relates to a photo and radiation-sensitive organopolymeric material having a high sensitivity to light and radiation, and particularly to a photo and radiation-sensitive organopolymeric material having a good resistance to dry etching.

DESCRIPTION OF THE PRIOR ART

In the fabrication of electronic parts such as semiconductor devices, integrated circuits, etc. a fine patterning technique based on photoetching is used.

For example, a photo-resist layer is formed on a silicon single crystal wafer, etc. by spin coating, and a mask of desired pattern is placed thereon, followed by light exposure, development, rinsing, etc. to form an image. Then, lines or windows having a width of a few μm are formed by etching. In the foregoing fine patterning technique, the precision of products depends mostly on the properties of a photoresist used, for example, resolution and photosensitivity on a substrate, adhesion to the substrate or resistance to etching.

The photoresist is classified into two types, that is, a negative type resist whose exposed parts are insolubilized and a positive type resist whose exposed parts are solubilized.

Generally, the negative type resist has a good sensitivity, but a poor resolution, and thus is not suitable as a fine patterning resist, whereas the positive type resist has a good resolution, but poor sensitivity and resistance to etching, and an improvement of the sensitivity and resistance to etching has been desired.

Recently, a process for forming a pattern having a width of not more than 1 μm has been desired to make the density and integration density of semiconductor devices, etc. higher, where a lithography using a radiation of high energy level such as electron beams, X-ray or ion beams is used in place of the conventional lithography using the light. In that process, it is known that a positive-type radiation-sensitive organopolymeric material has a good resolution and a poor sensitivity, as compared with a negative-type radiation-sensitive organopolymeric material. Thus, an improvement of resolution has been keenly desired for the negative-type resist material, whereas an improvement of sensitivity has been keenly desired for the positive-type resist material.

With finer patterning of semiconductor devices, etc., etching of the underlayer after patterning of a resist layer has been now carried out according to a dry-etching process in place of the conventional wet-etching process. Thus, a higher resistance to dry etching has been required for a resist material, but the conventional resist materials have not had a highly enough resistance to dry etching. Thus, an improvement of the resistance has been keenly desired [M. J. Boulden and L. F. Thompson: Solid State Technology 23 (5)72-82 (1979)].

SUMMARY OF THE INVENTION

An object of the present invention is to provide a photo and radiation-sensitive material having a high sensitivity to a radiation of light and high energy level beams, such as electron beams, X-rays, etc., and particularly to provide a photo and radiation-sensitive material having a good resistance to dry etching.

As a result of extensive studies of materials which seemed to have a good photo and radiation sensitivity and also to have a good resistance to dry etching to obtain the said object, the present inventors have found that a polymeric material having at least one Si—Si$_n$ bond in the molecule has a good effect among the materials for this purpose where n is an integer of from 1 to 5.

That is, a photo and radiation-sensitive organopolymeric material of the present invention has at least one unit represented by the following general formula (1) as the main constituent:

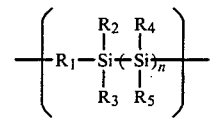

wherein $R_1$ is a divalent organic group; $R_2$, $R_3$, $R_4$ and $R_5$ are methyl, ethyl, propyl and phenyl; n is an integer of from 1 to 5.

The divalent organic group for $R_1$ includes:
(A) a divalent organic group having only at least one aromatic ring structure,
(B) a divalent organic group having at least one aromatic ring structure and at least one chain structure,
(C) an alkylene group, or
(D) a divalent organic group containing at least one hetero atom.

The divalent organic group of said (A) includes

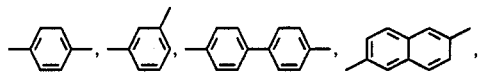

etc.

The divalent organic group of said (B) includes

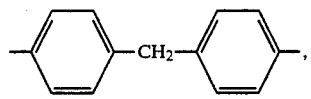

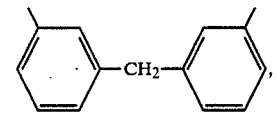

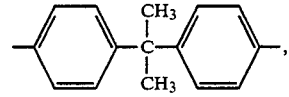

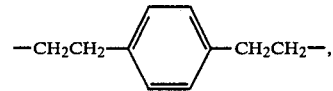

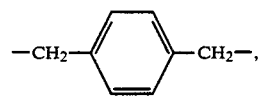

etc.

The divalent organic group of said (C) includes —CH₂CH₂—, —CH₂CH₂CH₂—, etc.

The divalent organic group of said (D) includes

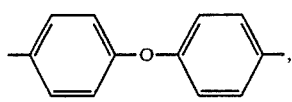

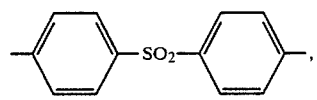

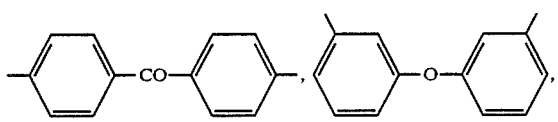

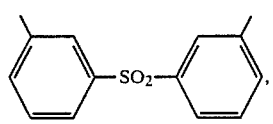

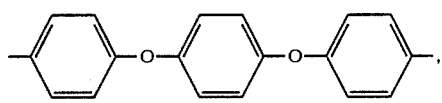

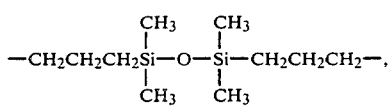

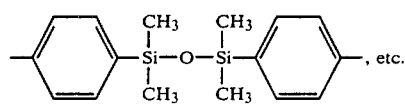, etc.

Furthermore, divalent organic groups whose aromatic ring or rings has or have at least one of halogen atoms, alkyl groups, etc. as a substituent can be used. For example, in this case, the following groups can be included:

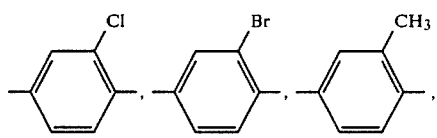

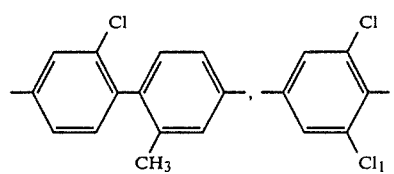

etc.

In the foregoing general formula (1), $R_2$, $R_3$, $R_4$ and $R_5$ are methyl, ethyl, propyl and phenyl, and can be the same organic groups, but in view of the solubility of polymeric material, it is desirable that $R_2$, $R_3$, $R_4$ and $R_5$ consist of at least two kinds of organic groups, for example, $R_2$ and $R_4$ are methyl groups and $R_3$ and $R_5$ are phenyl groups.

The present photo and radiation-sensitive organopolymeric material as described above undergoes reaction to break the Si—Si bond efficiently by light or radiation exposure. As a result, the exposed parts are selectively solubilized in a developing liquid in the case of light exposure, whereas in the case of radiation exposure, the exposed parts are selectively insolubilized or solubilized in a developing liquid. Thus, at least one Si—(-Si)ₙ bond must be contained in a polymeric material in principle, where n is an integer of from 1 to 5.

The present photo and radiation-sensitive organopolymeric material has a very high resistance to an oxygen plasma, and no reduction in film thickness is observed at all even if the present organopolymeric material is left standing for a long time in an oxygen plasma. It seems that an oxide film such as SiO₂-like film is formed as a surface layer by exposure to the oxygen plasma. Thus, when the present polymeric material is applied to various dry-etching processes, an oxygen plasma pretreatment is very advantageous to formation of a finer pattern. Furthermore, it is possible to make a film thinner, when the present organopolymeric material is applied as a resist, owing to a good resistance to the dry etching, and as a result, a pattern resolution can be increased with a very good advantage to finer patterning.

When the present photo and radiation-sensitive organopolymeric material is applied to formation of a pattern of semiconductor device, etc., a solution of the polymeric material in the ordinary organic solvent such as toluene, carbon tetrachloride, etc. is used. The solution of the polymeric material (resist solution) is applied to a device substrate by spin coating and then prebaked under an appropriate temperature condition, and subjected to light or radiation exposure according to a desired pattern. After the exposure, the exposed parts are selectively solubilized insolubilized with a developing liquid such as a solvent mixture of toluene and isopropyl alcohol, a solvent mixture of carbon tetrachloride and isopropyl alcohol, or toluene, or the like, whereby a positive-type resist pattern or a negative-type resist pattern can be obtained.

The present photo and radiation-sensitive organopolymeric material is in a crystalline state under the normal condition, and is readily soluble in an organic solvent such as toluene, etc., and thus can be molded into various shaped articles, such as films, fibers, sheets, etc. from the solution.

Furthermore, the present photo and radiation-sensitive organopolymeric material has a good adhesion to various kinds of metal and glass, and thus can be applied as an adhesive, a coating agent, etc.

Still furthermore, the present polymeric material is very useful as a functional polymeric material. That is, the present polymeric material can be used as an effective photo-sensitive material or a radiation-sensitive material, or an effective insulating material, etc. owing to a high resistance to heat.

The present polymeric material has a number average molecular weight of 1,000 to 1,000,000, and below 1,000, it is difficult to use it as a functional polymeric material.

The present polymeric material can be mixed with well known additives, for example, an antioxidant, a heat stabilizer, a coloring agent, a flame retardant, etc. according to the well known procedure.

DETAILED DESCRIPTION OF THE PREFERRED EMBODIMENTS

Figure 1:
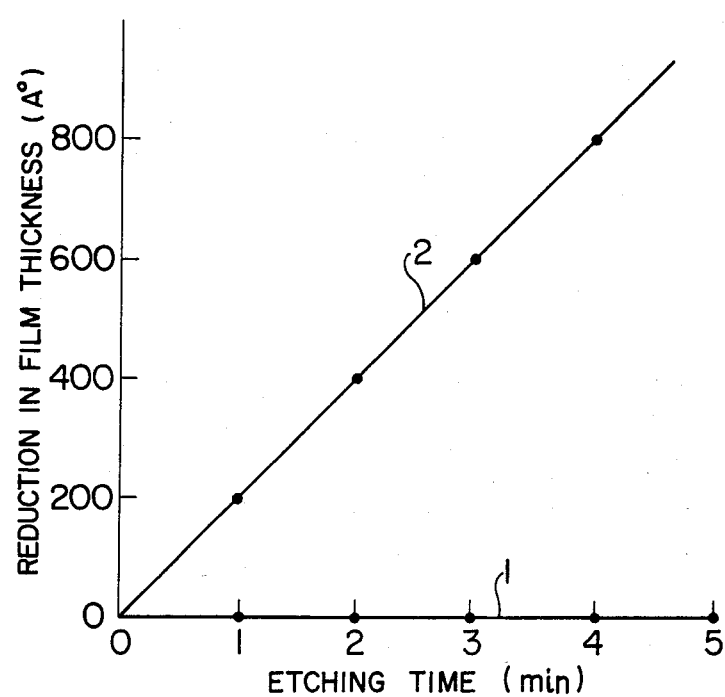
FIG. 1 is a diagram showing a resistance to an oxygen plasma of a resist film made from the present photo and radiation-sensitive organopolymeric material, where a relationship between the oxygen plasma etching time and the reduction in thickness of the resist film is given.

The present invention will be described in detail below, referring to Preparation Examples and Examples.

PREPARATION EXAMPLE 1

16.2 g of ethylmethyldiethoxysilane, 2.43 g of magnesium and 10 ml of tetrahydrofuran were charged into a 500-ml, three-necked flask provided with a stirrer, a cooler and a dropping funnel and stirred under a nitrogen gas stream, while 100 ml of a tetrahydrofuran solution containing 11,8 g of p-dibromobenzene was dropwise added thereto from the dropping funnel over about 3 hours. After the dropwise addition, the mixture was further stirred and refluxed for about 5 hours. After the refluxing, the resulting polymer was separated by filtration, and then the solvent was removed therefrom by distillation. The residues were then subjected to distillation under reduced pressure, whereby 10.5 g of p-bis(ethylmethylethoxysilyl)benzene was obtained (yield: 68%, boiling point: 122°–125° C./3 mmHg).

NMR spectrum (CDCl$_3$) δ (ppm): 0.42(s), 0.86–1.08(m), 1.26(t), 3.74(g), 7.56(s)

Then, 9.3 g of the thus obtained p-bis(ethylmethylethoxysilyl)benzene and 12 g of acetylchloride were refluxed for about 5 hours, whereby 8.6 g of p-bis(chloroethylmethylsilyl)benzene was obtained (yield: 98%, boiling point: 131°–135° C./3 mmHg).

NMR spectrum (CDCl$_2$) δ (ppm): 0.68(s), 1.12(s), 7.68(s)

PREPARATION EXAMPLE 2

30 ml of a toluene solution containing 5.8 g of p-bis(chloroethylmethylsilyl)benzene obtained in Preparation Example 1 was slowly dropwise added to a dispersion solution of 1.2 g of sodium in about 50 ml of toluence in a 200-ml, three-necked flask provided with a stirrer, a cooler, and a dropping funnel in a nitrogen gas stream, and the mixture was heated at 70°–80° C. for about 20 hours. After the heating, the resulting polymer was reprecipitated in a benzene-ethanol solution (1:1 by volume), whereby white powder of polymer having the following composition was obtained in a yield of about 65% (melting point: 186°–189° C.).

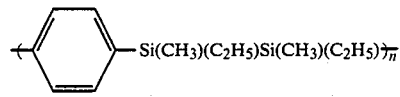

Number average molecular weight: 34,000

NMR spectrum (C$_6$D$_6$) δ (ppm): 0.34(s), 0.94(broad s), 7.28(s) IR spectrum:

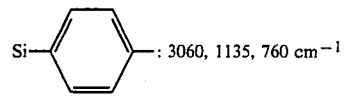: 3060, 1135, 760 cm$^{-1}$

Si—CH$_3$: 2970, 1385, 1260, 790 cm$^{-1}$
Si—C$_2$H$_5$: 1465, 1420, 1238, 1012, 960 cm$^{-1}$
UV spectrum: λmax (ε) 262 nm (8400)

PREPARATION EXAMPLE 3

21.0 g of methylphenyldiethoxysilane, 2.43 g of magnesium and 100 ml of tetrahydrofuran were charged into a 500-ml, three-necked flask provided with a stirrer, a cooler, and a dropping furnel and stirred in a nitrogen gas stream, while 100 ml of a tetrahydrofuran solution containing 11.8 g of p-dibromobenzene was dropwise added thereto from the dropping furnnal over about 3 hours. After the dropwise addition, the mixture was further stirred and refluxed for about 5 hours. After the refluxing, the resulting polymer was separated by filtration, and the solvent was removed therefrom by distillation. The residues were subjected to distillation under reduced pressure, whereby 15 g of p-bis(methylphenylethoxysilyl)benzene was obtained (yield: 78%, boiling point: 213°–215° C./3 mmHg).

NMR spectrum (CCl$_4$) δ (ppm): 0.76 (3H, s, Me-Si), 1.36 (3H, t, CH$_3$-C), 3.94 (2H, q, CH$_2$-Si), 7.4–7.8 (7H, m, ring protons).

92 g of the thus obtained p-bis(methylphenylethoxysilyl)benzene and 250 g of acetyl chloride was refluxed for about 5 hours, whereby 82 g of p-bis(chloromethylphenylsilyl)benzene was obtained (yield: 94%, boiling point: 229°–232° C./3 mmHg).

NMR spectrum (CCl$_4$) δ (ppm): 1.00 (3H, s, Me-Si), 7.5–7.8 (7H, m, ring protons).

PREPARATION EXAMPLE 4

100 ml of a benzene solution containing 15 g of p-bis(chloromethylphenylsilyl)benzene obtained in Preparation Example 3 was slowly dropwise added to a dispersion solution of 5 g of sodium in about 100 ml of toluene in a 300-ml, three-necked flask provided with a stirrer, a cooler and a dropping funnel in a nitrogen gas stream, and heated at 70°–80° C. for 20 hours. After the heating, the resulting polymer was reprecipitated in a benzene-ethanol solution (1:1 by volume), whereby white powder having a composition of the following formula was obtained in a yield of about 65%.

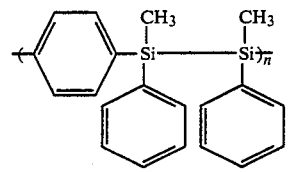

The properties and analytical results of the thus obtained polymer are given below:
Melting point: 155°–163° C.
Number average molecular weight: 34,000
NMR spectrum (C$_6$D$_6$) δ (ppm): 0.64 (3H, s, Me-Si), 7.26 and 7.30 (7H, ring protons) IR spectrum: 3080, 3060, 2980, 1435, 1385, 1260, 1130, 1110, 1000 cm$^{-1}$
UV spectrum: λmax 270 nm

EXAMPLE 1

The polymer having the following composition obtained in Preparation Example 2 was dissolved in toluene to obtain a 10 wt.% solution.

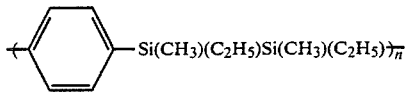

The solution was applied to a silicon wafer by spin coating at 1.000 rpm to form a polymer film having a thickness of 0.5 μm. Then, the film was pretaked at 90° C. for 30 minutes, and subjected to exposure of a 500 W xenon-mercury lamp (irradiation intensity: 12 mW/cm² at 254 nm) through a quartz mask.

After the irradiation, the wafer was dipped in a solvent mixture of toluene and isopropyl alcohol (1:3 by volume) for one minute and developed. By rinsing the wafer with isopropyl alcohol, the exposed parts were solubilized. As a result, a positive type resist pattern was obtained by the exposure for about 30 seconds.

The thus patterned resist film had a resistance to an oxygen plasma shown by 1 in FIG. 1, where no reduction in film thickness was observed even when it was left standing in the oxygen plasma. Thus, it was found that it had a very high resistance to dry etching. In FIG. 1, the resistance to an oxygen plasma of polyimide resin as one of distinguished materials having a good resistance to dry etching is shown by 2 for comparison, where the rate of reduction in film thickness was 200 A°/minute. Furthermore, the present resist film had a good resolution, and lines and spaces with a width of 1 μm could be resolved by contact exposure.

EXAMPLE 2

A film of the polymer obtained in Preparation Example 2 having a thickness of 0.5 μm was formed in a silicon wafer in the same manner as in Example 1, and subjected to exposure of electron beams under an acceleration potential of 20 KV in vacuum. After the exposure, the wafer was dipped in toluene for one minute and developed. By rinsing the wafer with isopropyl alcohol, a negative-type resist pattern was obtained by an irradiation dosage of $1 \times 10^{-5}$ C/cm².

The resistance to an oxygen plasma of the thus patterned resist film was investigated, and it was found that no reduction in film thickness was observed at all as in Example 1, and that the resist film had a very good resistance to dry etching. Furthermore, the resist film had a good resolution, and lines and spaces with a width of 1 μm could be resolved by exposure to electron beams.

EXAMPLE 3

The polymer having the following composition obtained in Preparation Example 4 was dissolved in toluene to obtain a 10 wt% solution.

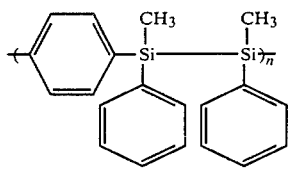

The solution was applied to a silicon wafer by spin coating at 1.000 rpm to obtain a polymer film having a thickness of 0.5 μm. Then, the wafer was prebaked at 90° C. for 30 minutes and subjected to exposure of a 500 W xenon-mercury lamp (irradiation intensity: 12 mW/cm² at 254 nm) through a quartz mask. After the exposure, the wafer was dipped in a solvent mixture of toluene-isopropyl alcohol (1:3 by volume) for one minute, and developed. By rinsing the wafer by isopropyl alcohol, the exposed parts were solubilized. As a result, a positive-type resist pattern was obtained by the exposure for about 30 seconds.

The thus patterned resist film had a resistance to an oxygen plasma as shown by 1 in FIG. 1, where no reduction in film thickness was observed at all, even when it was left standing in the oxygen plasma, and it was found that the resist film had a very high resistance to dry etching.

Figure 2:
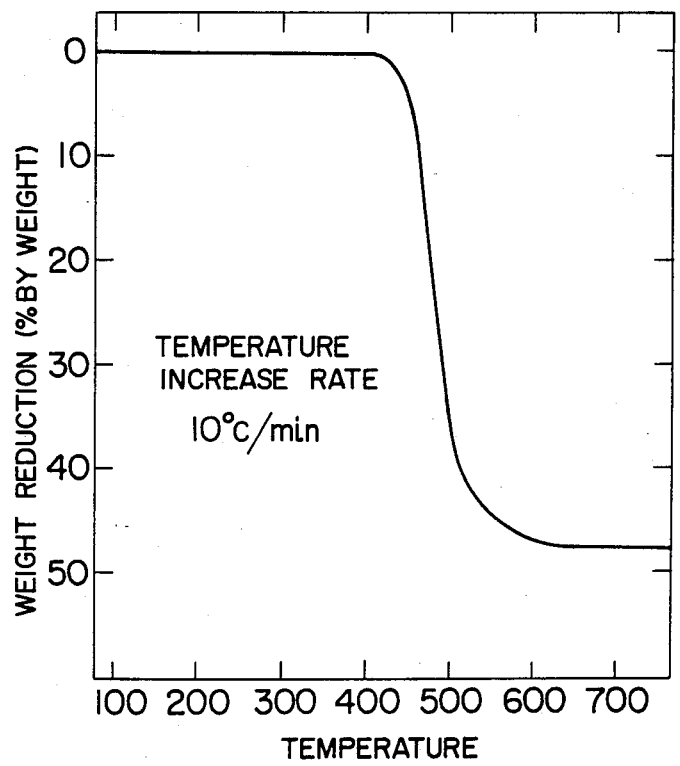
FIG. 2 is a diagram showing a thermal decomposition curve of the present organopolymeric material as used in FIG. 1, where the reduction in weight is plotted against the heating temperature.

Furthermore, the present resist film had a thermal decomposition initiation temperature of 400° C. as shown in FIG. 2 and had also a good resistance to heat.

EXAMPLE 4

A film of the polymer obtained in Preparation Example 4 having a thickness of 0.5 μm was formed on a silicon wafer in the same manner as in Example 3, and then subjected to exposure of electron beams under an acceleration potential of 20 KV in vacuum. After the exposure, the wafer was dipped in toluence for one minute and developed. Then, by rinsing the wafer with isopropyl alcohol, a negative-type resist pattern was obtained by an irradiation dosage of $1 \times 10^{-5}$ C/cm².

The resistance to an oxygen plasma of the thus patterned resist film was investigated, and it was found that no reduction in film thickness was observed at all, as in Example 3, and the resist film had a very high resistance to dry etching.

Furthermore, the present resist film had a good resolution, and lines and spaces with a width of 1 μm could be resolved by exposure to electron beams.

What is claimed is:

1. A photo and radiation-sensitive organopolymeric material which consists of units represented by the general formula (1):

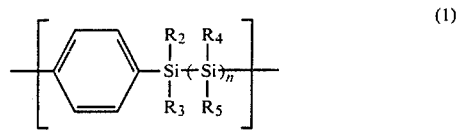

wherein $R_2$, $R_3$, $R_4$, and $R_5$ are selected from the group consisting of methyl, ethyl, propyl and phenyl; and n is an integer of 1 to 5.

2. A photo and radiation-sensitive organopolymeric material according to claim 1, wherein said material has an average molecular weight of 1,000 to 1,000,000.

3. A photo and radiation-sensitive organopolymeric material according to claim 1, wherein $R_2$ and $R_4$ are methyl groups; $R_3$ and $R_5$ are phenyl groups.

4. A photo and radiation-sensitive organopolymeric material according to claim 1, wherein $R_2$ and $R_4$ are methyl groups; $R_3$ and $R_5$ are phenyl groups; n is 1.

5. A photo and radiation-sensitive organopolymeric material according to claim 1, wherein $R_2$ and $R_4$ are methyl groups and $R_3$ and $R_5$ are ethyl groups.

6. A photo and radiation-sensitive organopolymeric material according to claim 1, wherein $R_2$ and $R_4$ are methyl groups; $R_3$ and $R_4$ are ethyl groups; and n is 1.

* * * * *